US010466279B2

(12) United States Patent
Seon

(10) Patent No.: US 10,466,279 B2
(45) Date of Patent: Nov. 5, 2019

(54) ANALOG SIGNAL DETECTING CIRCUIT FOR PROCESSING AN ANALOG SIGNAL FOR MONITORING BY DISCRIMINATING THE NORMAL SIGNAL FROM NOISE

(71) Applicant: LSIS CO., LTD., Anyang-si, Gyeonggi-do (KR)

(72) Inventor: Jongkug Seon, Anyang-si (KR)

(73) Assignee: LSIS CO., LTD., Anyang-si, Gyeonggi-Do (KR)

( * ) Notice: Subject to any disclaimer, the term of this patent is extended or adjusted under 35 U.S.C. 154(b) by 364 days.

(21) Appl. No.: 15/461,359

(22) Filed: Mar. 16, 2017

(65) Prior Publication Data
US 2017/0299637 A1 Oct. 19, 2017

(30) Foreign Application Priority Data

Apr. 18, 2016 (KR) ........................ 10-2016-0047193

(51) Int. Cl.
*G01R 19/10* (2006.01)
*G01R 19/165* (2006.01)
*H02H 3/16* (2006.01)

(52) U.S. Cl.
CPC ....... *G01R 19/10* (2013.01); *G01R 19/16528* (2013.01); *G01R 19/16571* (2013.01); *H02H 3/16* (2013.01)

(58) Field of Classification Search
CPC ...... G01R 19/00; G01R 19/10; G01R 19/165; G01R 19/16528; G01R 19/16566; G01R 19/16571; H02H 3/16; H02H 3/33
See application file for complete search history.

(56) References Cited

U.S. PATENT DOCUMENTS 4,069,452 A   1/1978  Conway et al.
4,365,236 A  12/1982  Maida
(Continued)

FOREIGN PATENT DOCUMENTS

CN      1580790 A   2/2005
CN    101441230 A   5/2009
(Continued)

OTHER PUBLICATIONS

Japanese Office Action for related Japanese Application No. 2017-079517; action dated Feb. 20, 2018; (2 pages).
(Continued)

*Primary Examiner* — Thienvu V Tran
*Assistant Examiner* — Nicolas Bellido
(74) *Attorney, Agent, or Firm* — K&L Gates LLP

(57) ABSTRACT

The analog signal detecting circuit comprises a reference voltage generator that outputs a plurality of reference voltages, the number of the reference voltages being varied depending on a voltage width between a minimum voltage value and a maximum voltage value of an analog signal; a plurality of comparators that compares a voltage of the analog signal with each of the plurality of reference voltages output from the reference voltage generator; a plurality of pulse generators that outputs a plurality of pulse signals having widths among the plurality of pulse signals varied depending on a frequency of the analog signal; and a combiner circuit section that outputs the pulse signals from the plurality of pulse generators by summing up.

8 Claims, 5 Drawing Sheets

(56) References Cited

U.S. PATENT DOCUMENTS

| | | | |
|---|---|---|---|
| 6,442,378 B1 | 8/2002 | Aboukhalil | |
| 2009/0051575 A1* | 2/2009 | Lee | G09G 3/20 341/136 |
| 2009/0168583 A1* | 7/2009 | Kwon | G11C 5/145 365/226 |
| 2012/0257314 A1* | 10/2012 | Armstrong | G01R 31/3272 361/42 |
| 2014/0233144 A1* | 8/2014 | Seon | G01R 19/02 361/115 |

FOREIGN PATENT DOCUMENTS

| | | |
|---|---|---|
| CN | 101930245 A | 12/2010 |
| CN | 102565514 A | 7/2012 |
| CN | 102694364 A | 9/2012 |
| CN | 103995173 A | 8/2014 |
| JP | S5074461 | 10/1973 |
| JP | S5184279 | 7/1976 |
| JP | S53143377 | 12/1978 |
| JP | H04200229 A | 7/1992 |
| JP | H06216724 A | 8/1994 |
| JP | 1995-226683 | 8/1995 |
| JP | 1996-111162 | 4/1996 |
| JP | 1998-042451 | 2/1998 |
| JP | 2009106072 | 5/2009 |
| JP | 2012008088 | 1/2012 |
| KR | 587969 | 6/2006 |

OTHER PUBLICATIONS

Korean Intellectual Property Office Application No. 10-2016-0047193, Search report dated Apr. 22, 2016, 4 pages.

European Search Report for related European Application No. 17152623.9; report dated Sep. 25, 2017; (5 pages).

Chinese Office Action for related Chinese Application No. 201710104601.0; action dated Mar. 25, 2019; (6 pages).

\* cited by examiner

ANALOG SIGNAL DETECTING CIRCUIT FOR PROCESSING AN ANALOG SIGNAL FOR MONITORING BY DISCRIMINATING THE NORMAL SIGNAL FROM NOISE

CROSS-REFERENCE TO RELATED APPLICATION

Pursuant to 35 U.S.C. § 119(a), this application claims the benefit of earlier filing date and right of priority to Korean Application No. 10-2016-0047193, filed on Apr. 18, 2016, the contents of which are all hereby incorporated by reference herein in its entirety.

BACKGROUND OF THE INVENTION

1. Field of the Invention

The present invention relates to an analog signal detecting circuit, and more particularly, to an analog signal detecting circuit that can reliably detect an abnormal signal by simultaneously detecting a magnitude and a frequency of an analog signal.

2. Description of the Related Art

The present invention relates to an analog signal detecting circuit that can reliably detect an analog signal of a fault current such as a leakage current or a short current for an earth leakage breaker or a circuit breaker. In this analog signal detecting circuit, an example of the related art will be described with reference to FIGS. 1 and 2.

As seen with reference to FIG. 1 which is a block diagram illustrating a configuration of an analog signal detecting circuit according to an example of the related art, the analog signal detecting circuit according to the related art includes an analog-to-digital converter 10, a root mean square (RMS) detector 20, a frequency detector 30, and a signal processor 40.

The analog-to-digital converter 10 converts an analog signal to a digital signal.

The RMS detector 20 takes an average of root mean square values, that is, an average of squared values for the digital signals output from the analog-to-digital converter 10 for a predetermined time and calculates a value obtained by taking root for the average value of the squared values.

The frequency detector 30 can calculate a frequency by counting the number of logic high, that is 1 or logic low, that is 0 of the digital signal output from the analog-to-digital converter 10 for a predetermined time and then dividing the number counted by time, and can calculate a cycle by using a cycle-frequency relation equation, which is well known, on the basis of the calculated frequency.

$$T = \frac{1}{2\pi f}$$

In this case, T is the cycle, and f is the frequency.

The root mean square value (magnitude of the analog signal) detected from the RMS detector 20 and the frequency and the cycle, which are detected from the frequency detector 30, can be delivered to the signal processor 40 at the next stage and processed by being compared with a predetermined reference value by the signal processor 40 on the basis of the magnitude (root mean square value) and the frequency of the analog signal.

However, the aforementioned example of the related art has a problem in that it is not suitable for the earth leakage circuit breaker or the circuit breaker due to high cost and its magnitude which is not small.

Also, the RMS detector 20 needs a stabilizing time for detecting an exact signal value, and the earth leakage circuit breaker or the circuit breaker should break a circuit within a predetermined instantaneous operation time defined by a standard. In this case, a problem may occur in that current breaking of a leakage current or a short current can be failed within a required instantaneous operation time due to the stabilizing time.

Meanwhile, an analog signal detecting circuit according to another example of the related art as shown in FIG. 2 includes a current transformer 1 and a peak detecting circuit 2.

The current transformer 1 detects a current flowing through a circuit as an analog signal and provides the detected current to the peak detecting circuit 2.

The peak detecting circuit 2 includes a half-wave rectifier and a capacitor for smoothing, rectifies and smooths a detected current, and compares the detected current having a DC value with an abnormal determination reference value which is previously set. If the abnormal determination reference value exceeds the DC value of the detected current, the peak detecting circuit 2 outputs a trip control signal to a trip mechanism 3a.

If the trip mechanism 3a is operated to a trigger position by the trip control signal, a switching mechanism 3b interlocked to the trip mechanism 3a can perform a trip operation to a circuit breaking position to protect an electric load from an abnormal current (fault current) such as an earth leakage current or a short current.

However, the analog signal detecting circuit according to another example of the related art as shown in FIG. 2 has a problem in that the peak detecting circuit 2 fails to rectify and smooth a detecting current if a rapidly great current as the detecting current flows to the circuit within a short time due to thunderbolt, etc.

SUMMARY OF THE INVENTION

Therefore, the present invention can solve the aforementioned problems. Accordingly, an object of the present disclosure is to provide an analog signal detecting circuit that does not need a stabilizing time, can be manufactured at low cost, and can reliably detect even an analog signal which rapidly varies.

To achieve these and other objects and in accordance with the purpose of the present disclosure, as embodied and broadly described herein, according to the present disclosure, an analog signal detecting circuit comprising: a reference voltage generator that generates and outputs a plurality of reference voltages, the number of the reference voltages being varied depending on a voltage width between a minimum voltage value and a maximum voltage value of an analog signal which is input; a plurality of comparators that compares a voltage of the analog signal with each of the plurality of reference voltages output from the reference voltage generator; a plurality of pulse generators that generates and outputs a plurality of pulse signals having varying widths among the plurality of pulse signals depending on a frequency of the analog signal; and a combiner circuit section that outputs the pulse signals from the plurality of pulse generators by summing up.

In accordance with one preferred aspect of the present disclosure, the analog signal detecting circuit according to the disclosure, further comprises a minimum value detecting circuit section that detects the minimum voltage value of the analog signal and provides the minimum voltage value to the reference voltage generator; and a maximum value detecting circuit section that detects the maximum voltage value of the analog signal and provides the maximum voltage value to the reference voltage generator.

In accordance with another preferred aspect of the present disclosure, each of the pulse generators comprises: a delay circuit section that outputs an output signal of any one of the plurality of comparators through time delay; and an exclusive OR circuit section that has a first input terminal for receiving an output signal of a corresponding one of the plurality of comparators and a second input terminal for receiving the output signal output from the delay circuit section, and generates a pulse signal when a logic value of the output signal of the corresponding one of the plurality of comparators is different from a logic value of the output signal of the delay circuit section.

In accordance with still another preferred aspect of the present disclosure, the analog signal detecting circuit according to the disclosure further comprises an average circuit section that is connected to the combiner circuit section, outputs an average value of the pulse signals output from the combiner circuit section.

In accordance with still another preferred aspect of the present disclosure, the analog signal detecting circuit according to the disclosure further comprises a determination circuit section that determines whether to generate and output a trip control signal by comparing the average value output from the average circuit section with a predetermined trip reference value of an earth leakage circuit breaker.

In accordance with still another preferred aspect of the present disclosure, the analog signal detecting circuit according to the disclosure further comprises a delay circuit section that is installed between the average circuit section and the determination circuit section, and delays the average value output from the average circuit section for a predetermined time and then outputs the average value to the determination circuit section.

In accordance with still another preferred aspect of the present disclosure, the analog signal detecting circuit according to the disclosure, further comprises a signal processor that calculates the frequency of the analog signal by counting the number of the pulse signals and dividing the number of the pulse signals by time or calculates a magnitude of the analog signal by multiplying the number of the pulse signals by a predetermined proportional coefficient, on the basis of the pulse signals output from the combine circuit section.

In accordance with still another preferred aspect of the present disclosure, the reference voltage generator is configured to generate the number of reference voltages proportional to the voltage width between the minimum voltage value and the maximum voltage value of the analog signal which is input.

In accordance with still another preferred aspect of the present disclosure, the plurality of pulse generators is configured to generate the plurality of pulse signals having wide widths among the plurality of pulse signals if the frequency of the analog signal is low.

Further scope of applicability of the present application will become more apparent from the detailed description given hereinafter.

BRIEF DESCRIPTION OF THE DRAWINGS

The accompanying drawings, which are included to provide a further understanding of the disclosure and are incorporated in and constitute a part of this disclosure, illustrate exemplary embodiments and together with the description serve to explain the principles of the disclosure.

In the drawings.

DETAILED DESCRIPTION OF THE INVENTION

Figure 1:
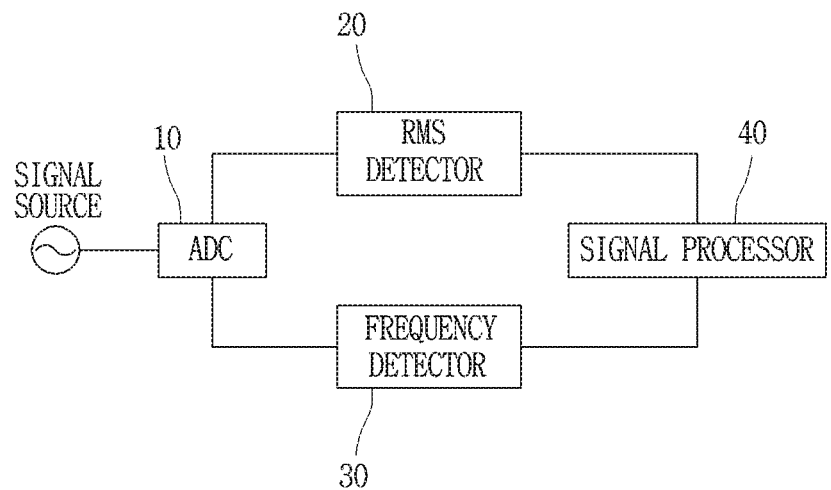
FIG. 1 is a block diagram illustrating a configuration of an analog signal detecting circuit according to an example of the related art.
Figure 2:
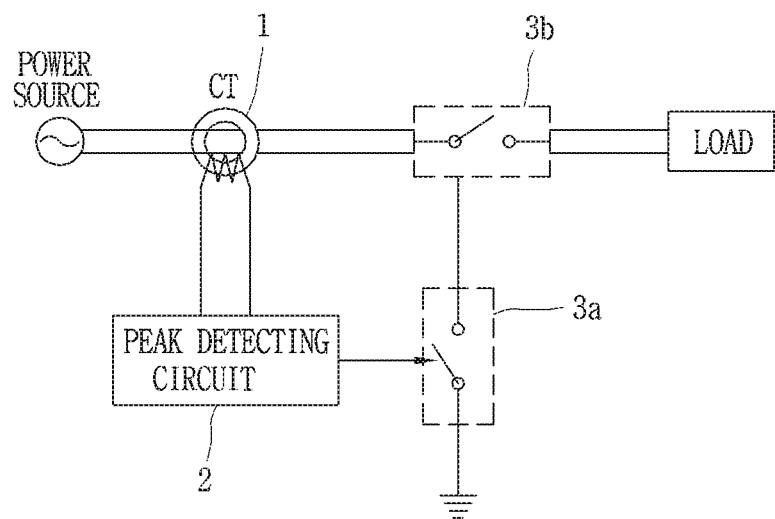
FIG. 2 is a block diagram illustrating a configuration of an analog signal detecting circuit according to another example of the related art.

Advantages and features of the present invention, and implementation methods thereof will be clarified through following embodiments described with reference to the accompanying drawings FIGS. 3 to 6.

An analog signal detecting circuit (analog signal detector) 200 according to one preferred embodiment of the present invention comprises a reference voltage generator 230, a plurality of comparators 240, a plurality of pulse generators 250, and a combiner circuit section 260.

The reference voltage generator 230 is a circuit section that generates a plurality of reference voltages and outputs the reference voltages through a plurality of reference voltage output terminals, wherein the number of the reference voltages is varied depending on a voltage width between a minimum voltage value and a maximum voltage value of an analog signal which is input.

The analog signal detecting circuit 200 according to one preferred embodiment of the present invention further comprises a minimum value detecting circuit section 210 and a maximum value detecting circuit section 220.

The minimum value detecting circuit section 200 detects a minimum voltage value of the analog signal and provides the detected minimum voltage value to the reference voltage generator 230.

The maximum value detecting circuit section 220 detects a maximum voltage value of the analog signal and provides the detected maximum voltage value to the reference voltage generator 230.

The reference voltage generator 230 may comprise an operation circuit section such as a microcomputer and a voltage dividing circuit section.

For example, in a state that a voltage difference value between a first reference voltage value and a second reference voltage value adjacent to the first reference voltage value in the plurality of reference voltages is a predetermined value, for example, 1 volt, and if the voltage width between the minimum voltage value and the maximum voltage value of the analog signal is 6.3 volt, the reference voltage value may be determined by the following Equation (1).

$$N = \frac{V_{DEF}}{V_{REFD}} + 1 \quad (1)$$

In this case, N is the number of reference voltages and is a natural number, $V_{DEF}$ is the voltage width between the minimum voltage value and the maximum voltage value of the analog signal, and $V_{REFD}$ is a difference value (for example, 1 volt as described above) between the reference voltages.

Therefore, if the difference value between the adjacent reference voltages is 1 volt and the voltage width between the minimum voltage value and the maximum voltage value of the analog signal is 6.3 volt, the number of the reference voltages is seven (7) in accordance with the above Equation (1).

Figure 5:
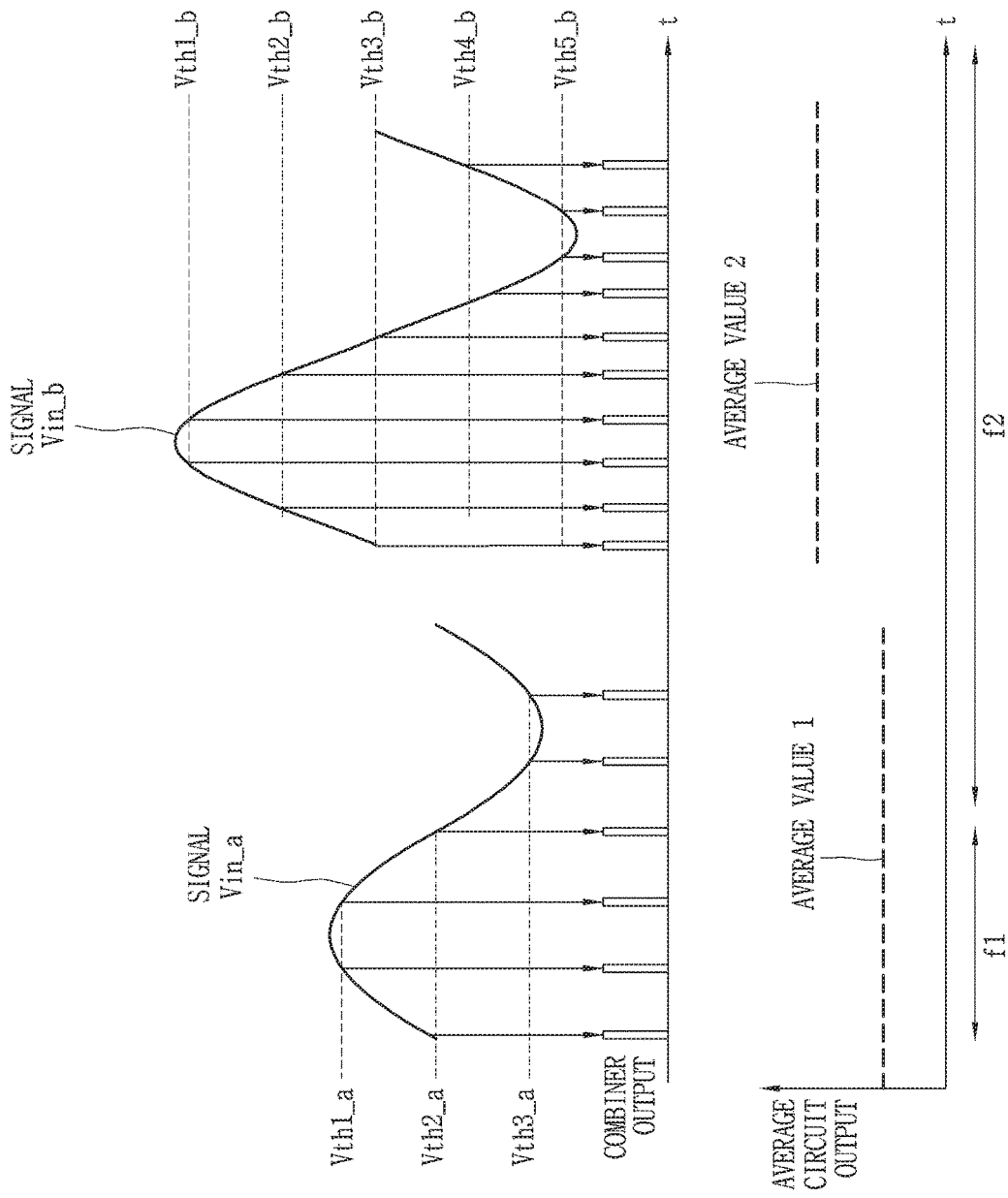
FIG. 5 is a waveform diagram illustrating output waveforms of a combiner circuit section and an average circuit section of an analog signal detecting circuit according to one preferred embodiment of the present invention, which are for detecting magnitudes of two different analog signals.

In the example shown in FIG. 5, with respect to an analog signal Vin_a having a small voltage width between the minimum voltage value and the maximum voltage value of two analog signals, that is, Vin_a and Vin_b, the reference voltage generator 230 generates three reference voltage signals, that is, Vth1_a, Vth2_a, and Vth3_a.

In the example shown in FIG. 5, with respect to the analog signal Vin_b having a large voltage width between the minimum voltage value and the maximum voltage value of the two analog signals, that is, Vin_a and Vin_b, the reference voltage generator 230 generates five reference voltage signals, that is, Vth1_b, Vth2_b, Vth3_b, Vth4_b, and Vth5_b.

The voltage dividing circuit section may comprise a plurality of serial resistors connected to a certain reference voltage source in series, a reference voltage output terminals from both ends of the serial resistors, and a selecting circuit of the reference voltage output terminals.

Each of comparators 240 has a reference voltage input terminal connected to one of reference voltage output terminals of the reference voltage generator 230 and a signal input terminal for inputting the analog signal, and compares the voltage of the analog signal with the one of reference voltages output from the reference voltage generator 230.

Particularly, among the plurality of comparators 240, only the comparator 240, which has received the reference voltage signal from the reference voltage generator 230 through the reference voltage input terminal, can compare the analog signal input through the signal input terminal with the reference voltage signal and output an output signal.

The plurality of pulse generators 250 have input terminals connected to the corresponding output terminals of the plurality of comparators 240, generate a plurality of pulse signals having widths among pulses, which are varied depending on the frequency of the analog signal, and output the generated pulse signals.

Figure 6:
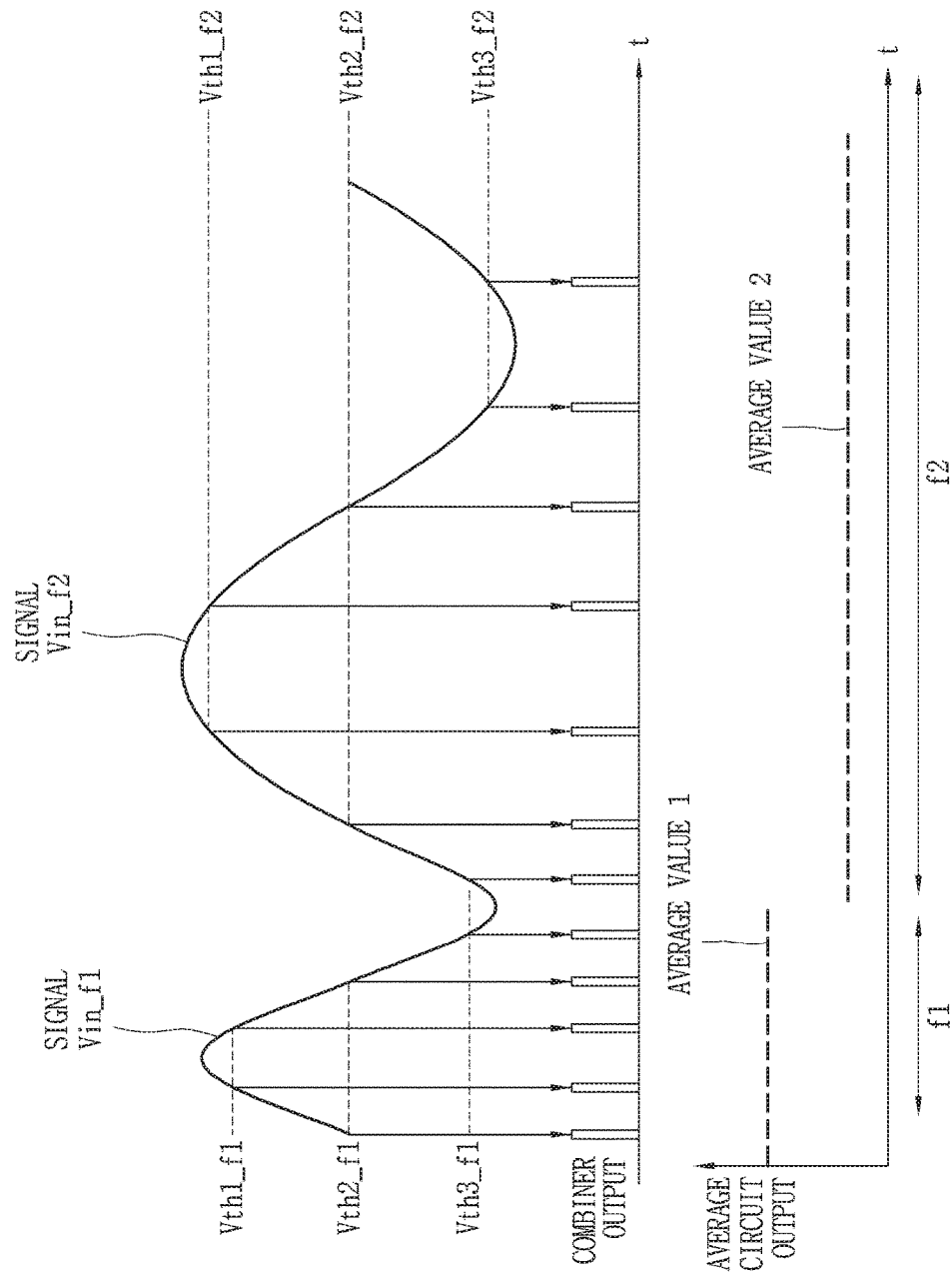
FIG. 6 is a waveform diagram illustrating output waveforms of a combiner circuit section and an average circuit section of an analog signal detecting circuit according to one preferred embodiment of the present invention, which are for detecting frequencies of two different analog signals.

That is, as seen with reference to FIG. 6, with respect to two analog signals, that is, Vin_f1 and Vin_f2 having the same magnitude (the difference value between maximum voltage value and minimum voltage value) and their respective frequencies different from each other, as the magnitudes of the two analog signals are the same as each other, the reference voltage generator 230 generates three reference voltages for the two analog signals. Also, as seen with reference to FIG. 6, with respect to the analog signal Vin_f1 having high frequency, the plurality of pulse generators 250 output pulse signals having short widths among pulses, and with respect to the analog signal Vin_f2 having low frequency, the plurality of pulse generators 250 output pulse signals having pulse widths longer than the widths among pulses for the analog signal Vin_f1.

Each of the plurality of pulse generators 250 comprises a delay circuit section 250a and an exclusive OR circuit section 250b.

The delay circuit section 250a outputs the output signal of the comparator 240 after a time delay.

The exclusive OR circuit section 250b has a first input terminal that receives the output signal of the comparator 240 and a second input terminal that receives a delayed output signal output from the delay circuit section 250a.

When a logic value of the output signal of the corresponding comparator 240 and a logic value of the output signal of the delay circuit section 250a are different from each other, the exclusive OR circuit section 250b generates a pulse signal having a HIGH logic value.

Although the output signals of the comparators 240 are initially short pulse signals having almost no pulse width of a logic value 1, when the logic value of the output signals of the comparator 240 becomes low, that is, 0 (zero), the output signal of the delay circuit section 250a becomes 1 after delay time, whereby the exclusive OR circuit section 250b maintains the output of the logic value 1 for the delay time.

Therefore, the pulse signals output from the plurality of pulse generators 250 become the pulse signals each having the pulse width as much as the delay time of the delay circuit section 250a.

As short pulse signals having almost no pulse width, which are difficult to be recognized and processed during signal processing at a following stage, the object of generating the pulse signals each having the pulse width as much as the delay time described above is to make the pulse signals each have a pulse width of a certain level or more which can be recognized and processed at the following stage.

The combiner circuit section 260 has input terminals connected to output terminals of the plurality of pulse generators 250, and sums up the pulse signals from the plurality of pulse generators 250 and outputs the result signal of the summing up. That is, the combiner circuit section 260 combines the pulse signals from the plurality of pulse generators 250.

The pulse signals combined by the combiner circuit section 260 are the same as all of the pulse signals marked as the combiner output in FIG. 5 or FIG. 6, and the pulse signals output from the output terminals of the plurality of pulse generators 250 are the same as the pulse signals marked with the combiner output in FIG. 5 or FIG. 6.

As seen with reference to the example shown in FIG. 5, in the pulse signals output from the combiner circuit section 260, six pulse signals are output for the signal Vin_a, and ten pulse signals are output for the signal Vin_b. Three reference voltages are generated for the signal Vin_a, and five reference voltages are generated for the signal Vin_b. Therefore, the number of the pulse signals output from the combiner circuit section 260 becomes two times of the number of the reference voltages which are generated.

The analog signal detecting circuit 200 according to one preferred embodiment of the present invention further comprises an average circuit section 270.

The average circuit section 270 has an input terminal connected to the output terminal of the combiner circuit section 260.

Also, the average circuit section 270 outputs an average value of the pulse signals output from the combiner circuit section 260. In this case, the average value of the pulse signals output from the average circuit section 270 is a value obtained by adding (summing up) values of the pulse signals for a predetermined time and then dividing the added value (the summed up value) by time, and the average value is an analog value.

In FIG. 5, supposing that a magnitude of a pulse output is maintained at 1 volt and time of 1 cycle for the signal Vin_a is 6 seconds and time of 1 cycle for the signal Vin_b is also 6 seconds, an average value 1 of the signal Vin_a can be calculated as expressed by the following Equation.

Average value 1=(1×6)/6=1

An average value 2 of the signal Vin_b can be calculated as expressed by the following Equation.

Average value 2=(1×10)/6≈1.67

It is noted that the average value 2 of the signal Vin_b is greater than the average value 1 of the signal Vin_a as above. This can be known even through waveform comparison of the average value 1 and the average value 2 in FIG. 5.

Meanwhile, in FIG. 6, with respect to the signals Vin_f1 and Vin_f2 having the same magnitude (difference value between maximum value and minimum value) and their respective frequencies different from each other, supposing that a magnitude of a pulse output is uniformly maintained at 1 volt and 1 cycle for the signal Vin_f1 is 6 seconds and 1 cycle for the signal Vin_f2 is 12 seconds, an average value 1 of the signal Vin_f1 for 6 seconds can be calculated as expressed by the following Equation.

Average value 1=(1×6)/6=1

An average value 2 of the signal Vin_f2 for the same time period can be calculated as expressed by the following Equation.

Average value 2=(1×4)/6≈0.67

It is noted that the average value 2 of the signal Vin_f2 is smaller than the average value 1 of the signal Vin_f1 as above. This can be known even through waveform comparison of the average value 1 and the average value 2 in FIG. 6.

As described above, the average value obtained by the average circuit section 270 can reliably provide the magnitude of a target analog signal for monitoring.

Figure 3:
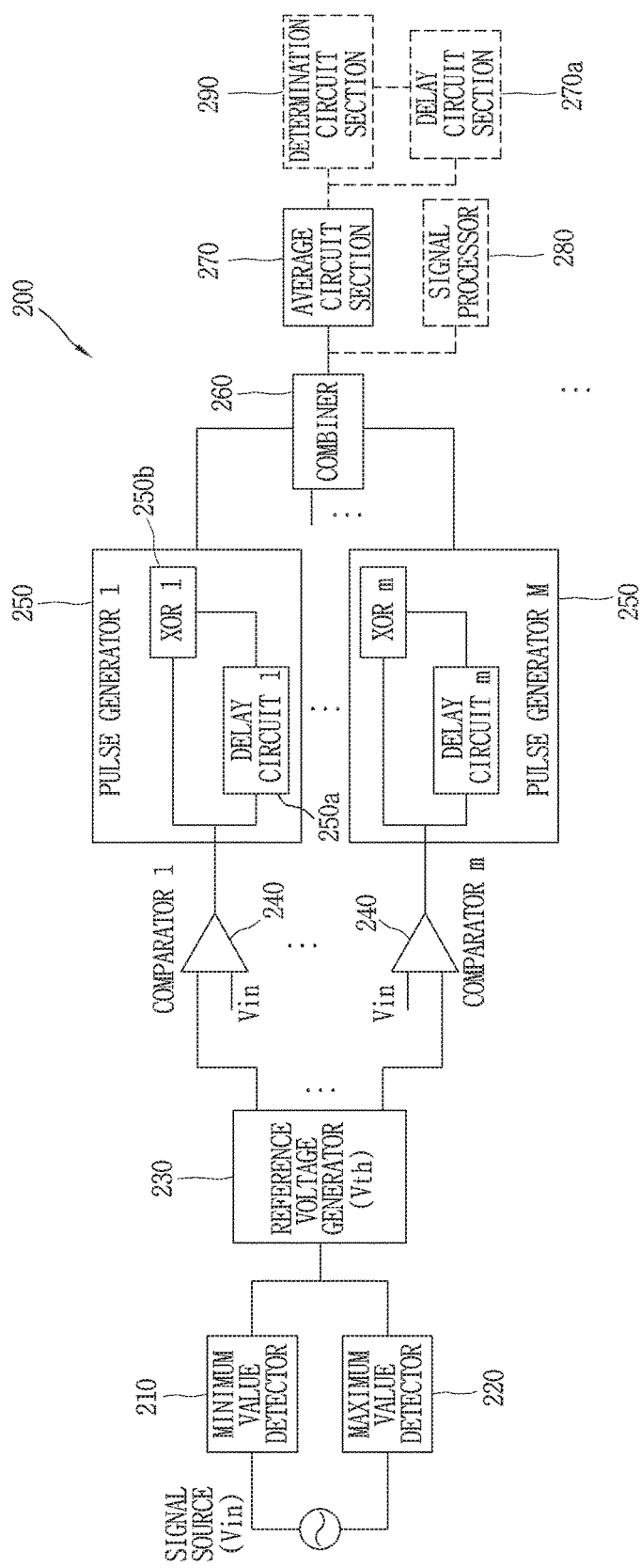
FIG. 3 is a block diagram illustrating a configuration of an analog signal detecting circuit according to one preferred embodiment of the present invention.

The analog signal detecting circuit 200 according to one preferred embodiment of the present invention may further comprise a signal processor 280. The signal processor 280 may be connected to the combiner circuit section 260 and connected to the average circuit section 270 in parallel as shown in FIG. 3.

The signal processor 280 can be provided to obtain a magnitude and frequency of the target analog signal for monitoring as a digital signal instead of an analog average value obtained by the average circuit section 270.

The signal processor 280 can calculate the frequency of the analog signal by counting the number of pulse signals and dividing the counted number by time or calculate the magnitude of the analog signal by multiplying the number of pulse signals by a predetermined proportional coefficient, on the basis of the pulse signals output from the combine circuit section 260.

To perform the above function, the signal processor 280 may comprise a comparator for recognizing the pulse signals output from the combine circuit section 260, a counter circuit for counting the output signals of the corresponding comparator, and an operation microcomputer for calculating the frequency by dividing the output of the counter circuit by time. The corresponding microcomputer can calculate the magnitude of the analog signal by multiplying the output of the counter circuit by the predetermined proportional coefficient.

Figure 4:
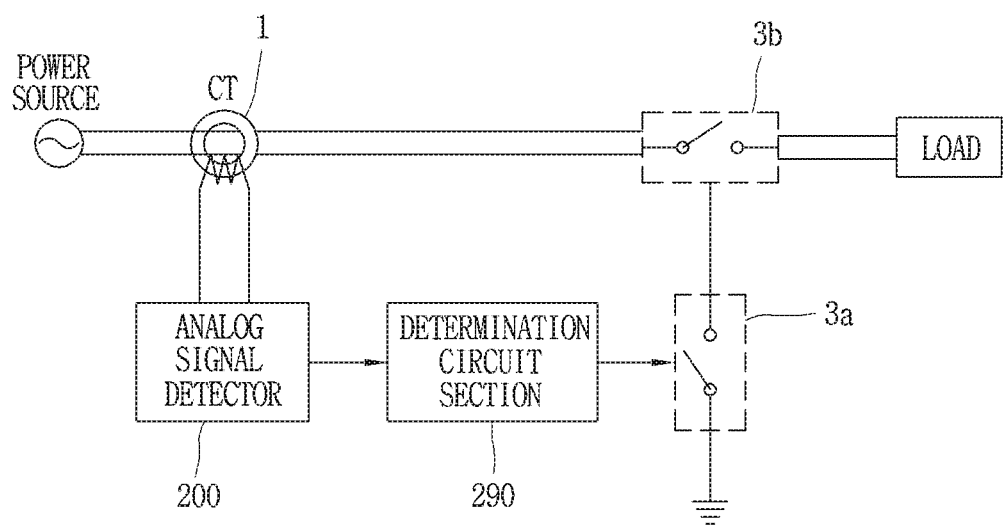
FIG. 4 is a block diagram illustrating an electrical configuration of an earth leakage circuit breaker that comprises an analog signal detecting circuit according to one preferred embodiment of the present invention.

The analog signal detecting circuit 200 according to one preferred embodiment of the present invention may further comprise a determination circuit section (discriminator) 290 as seen with reference to FIG. 4.

The determination circuit section 290 determines whether to generate and output a trip control signal by comparing the average value output from the average circuit section 270 with a predetermined trip reference value of the earth leakage breaker.

To this end, the determination circuit section 290 may comprise a comparator and a signal generator circuit section.

As can be seen from FIG. 3, the analog signal detecting circuit 200 according to one preferred embodiment of the present invention further comprises a delay circuit section 270a installed between the average circuit section and the determination circuit section, delaying the average value output from the average circuit section for a predetermined time and outputting the delayed average value to the determination circuit section.

When the delay circuit section 270a is installed between the average circuit section 270 and the determination circuit section 290, the determination circuit section 290 may further comprise another comparator for comparing an output signal of the average circuit section 270, which is currently input, with the output signal of the delay circuit section 270a.

As a result of comparison of this another comparator, if the output signal of the average circuit section 270, which is currently input, is the same as the output signal of the delay circuit section 270a, the output signal of the average circuit section 270 is maintained constantly and thus regarded as a reliable output signal. Therefore, the determination circuit section 290 determines whether to generate and output the trip control signal by comparing the output signal of the average circuit section 270, which is currently input, with the trip reference value.

If the output signal of the average circuit section 270 is different from the output signal of the delay circuit section 270a, it is noted that a noise signal is input. Therefore, since the output signal of the average circuit section 270, which is currently input, cannot be reliable, the determination circuit section 290 disregards the output signal of the average circuit section 270, which is currently input, without comparison with the trip reference value.

In FIG. 4, a reference numeral 1 designates a current transformer (CT) that is installed in an electric power circuit for monitoring (observation) and provides a voltage signal proportional to the amount of a current flowing on the electric power circuit as the target analog signal for monitoring.

In FIG. 4, a reference numeral 3a designates a trip mechanism for triggering a trip operation (automatic circuit breaking) of an earth leakage breaker or a circuit breaker, and for example, may comprise an electromagnet and an armature actuated by the electromagnet as well known.

In FIG. 4, a reference numeral 3b designates a switching mechanism of an earth leakage breaker or a circuit breaker as well known, and the switching mechanism 3b comprises a movable contact arm and a contact, which actually switch the circuit, a shaft as a driving mechanism for driving the movable contact arm to a circuit open position, a link, a trip spring, etc.

An operation of the aforementioned analog signal detecting circuit according to one preferred embodiment of the present invention will be described with reference to FIGS. 3-6.

In FIG. 4, if the analog signal (marked with a signal source Vin in FIG. 3) for monitoring as a voltage signal proportional to the amount of a current on the electric power circuit (abbreviated as circuit hereinafter) is applied from the current transformer 1 installed on the circuit for observation, the minimum value detecting circuit section 210 detects a minimum voltage value of the analog signal and provides the detected minimum voltage value to the reference voltage generator 230, and the maximum value detecting circuit section 220 detects a maximum voltage value of the analog signal and provides the detected maximum voltage value to the reference voltage generator 230.

The reference voltage generator 230 generates a plurality of reference voltages in accordance with a voltage width of the minimum voltage value and the maximum voltage value of the analog signal input from the minimum value detecting circuit 210 and the maximum value detecting circuit 220 and outputs the generated reference voltages through a plurality of reference voltage output terminals, wherein the number of the reference voltages is determined as expressed by the said Equation (1).

The comparators 240 corresponding to the determined number of the reference voltages compare the output reference voltage with the analog signal.

In this case, among the plurality of comparators 240, only the comparator 240, which has received the reference voltage signal from the reference voltage generator 230 through the reference voltage input terminal, can compare the analog signal input through the signal input terminal with the reference voltage signal and output an output signal.

The plurality of pulse generators 250 are provided to correspond to the number of the plurality of comparators 240, and output pulse signals in accordance with the output signals of the plurality of comparator, that is, the plurality of pulse generators 250 output pulse signals when the output signals of the comparators 240 are logic HIGH values.

Also, the plurality of pulse generators 250 generate a plurality of pulse signals having a varying width among the plurality of pulses depending on the frequency of the analog signal, and output the pulse signals.

As seen with reference to FIG. 6, with respect to two analog signals, that is, Vin_f1 and Vin_f2 having the same magnitude (difference value between maximum voltage value and minimum voltage value) and their respective frequencies different from each other, since the magnitudes of the two analog signals are the same as each other, the reference voltage generator 230 generates three reference voltages for the two analog signals Vin_f1, Vin_f2. With respect to the analog signal Vin_f1 having high frequency, the plurality of pulse generators 250 output pulse signals having short widths among the pulse signals, and with respect to the analog signal Vin_f2 having low frequency, the plurality of pulse generators 250 output pulse signals having widths longer than widths among the pulse signals for the analog signal Vin_f2.

Therefore, the combiner circuit section 260 outputs the pulse signals from the plurality of pulse generators 250 by summing up. In other words, the combiner circuit section 260 outputs the pulse signals by adding the pulse signals from the plurality of pulse generators 250.

The average circuit section 270 outputs an average value of the pulse signals output from the combiner circuit section 260. In this case, the average value of the pulse signals output from the average circuit section 270 is a value obtained by adding values of the pulse signals for a predetermined time and then dividing a sum value by time, and the average value is an analog value.

Then, the determination circuit section 290 of FIG. 4 determines whether to generate and output the trip control signal by comparing the average value output from the average circuit section 270 with the trip reference value of the earth leakage breaker, which is preset.

If the average value output from the average circuit section 270 of FIG. 4 is the trip reference value or more, the determination circuit section 290 generates and outputs the trip control signal.

The switching mechanism 3b operates as the trip mechanism 3a triggers, whereby the movable contact arm included in the switching mechanism 3b separates from a stationary contact arm corresponding to the movable contact arm. As a result, the circuit is automatically broken (tripped).

Therefore, an electric load can be protected from the fault current such as a leakage current or a short current.

If the average value output from the average circuit section 270 of FIG. 4 is less than the trip reference value, the determination circuit section 290 does not generate the trip control signal.

In this case, the trip mechanism 3a does not operate and thus the switching mechanism 3b does not operate, whereby the movable contact arm is in contact with the stationary contact arm corresponding to the movable contact arm. As a result, the electric power is normally supplied from the power source to the load side through the circuit.

As described above, the analog signal detecting circuit according to the present invention generates the plurality of reference voltages proportional to the voltage width between the minimum voltage value and the maximum voltage value of the analog signal through the reference voltage generator and compares the voltage of the analog signal with each of the plurality of reference voltages through the corresponding comparators, thereby outputting the pulse signals of proportional numbers to the magnitude of the analog signal without stabilizing time delay. Also, the analog detecting circuit according to the present invention can generate and output the pulse signals having varying width among the pulse signals depending on the frequency of the analog signal through the plurality of pulse generators corresponding to the plurality of reference voltages, thereby outputting the pulse signals reflected by the frequency of the analog signal. In this case, since the signal processor or the determination circuit section can exactly process the only analog signal for monitoring by discriminating the normal signal from noise, generation of a leakage current or a fault current for monitoring on the circuit can exactly be determined in application fields such as the earth leakage breaker or the circuit breaker. Therefore, it is advantageous that reliability in the operation of the earth leakage breaker or the circuit breaker can be improved.

Since the analog signal detecting circuit according to the present invention further comprises the minimum value detecting circuit section for detecting the minimum voltage value of the analog signal and providing the detected minimum voltage value to the reference voltage generator and the maximum value detecting circuit section for detecting the maximum voltage value of the analog signal and providing the detected maximum voltage value to the reference voltage generator, it is advantageous that the difference between the minimum voltage value and the maximum voltage value of the analog signal, that is, the magnitude of the analog signal can be determined.

In the analog signal detecting circuit according to the present invention, since each of the pulse generators comprises the delay circuit section and the exclusive OR circuit section, it is advantageous that the pulse signal having a pulse width as much as time delay of the delay circuit section can be provided.

Since the analog signal detecting circuit according to the present invention further comprises the average circuit section outputting an average value of the pulse signals output from the combiner circuit section, the analog signal detecting circuit can be affected by temporary noise within a minimum range, and the determination circuit section connected following to the analog signal detecting circuit can reliably determine the analog signal, that is, can reliably determine leakage current or fault current.

Since the analog signal detecting circuit according to the present invention further comprises the determination circuit section, the determination circuit section can determine whether to generate and output the trip control signal by comparing the average value output from the average circuit section with the predetermined trip reference value of the earth leakage breaker.

Since the analog signal detecting circuit according to the present invention further comprises the delay circuit section for delaying the average value output from the average circuit section for a predetermined time and outputting the delayed average value to the determination circuit section, an error operation in detecting a leakage current or a default current on the circuit due to the rapidly varied analog signal caused by temporary noise can be avoided.

Since the analog signal detecting circuit according to the present invention further comprises the signal processor for calculating the frequency of the analog signal by counting the number of the pulse signals and dividing the counted number by time or calculating the magnitude of the analog signal by multiplying the number of the pulse signals by a predetermined proportional coefficient, on the basis of the pulse signals output from the combine circuit section, it is advantageous that the magnitude and the frequency of the analog signal can be detected separately.

In the analog signal detecting circuit according to the present invention, since the reference voltage generator is configured to generate the number of reference voltages proportional to the voltage width between the minimum voltage value and the maximum voltage value of the analog signal which is input, whereby the pulse signals reflected by the features of the corresponding analog signal can be generated through comparison of the analog signal having a great magnitude with many reference voltages.

In the analog signal detecting circuit according to the present invention, since the plurality of pulse generators generate a plurality of pulse signals having a wide width among pulses if the frequency of the analog signal is low, the pulse signals reflected by the frequency of the analog signal can be output. In this case, the signal processor or the determination circuit section connected following to the analog signal detecting circuit can exactly process only the analog signal for detecting target by explicitly discriminating the normal signal from noise.

What is claimed is:

1. An analog signal detecting circuit for processing an analog signal for monitoring by discriminating a normal signal from noise, the analog signal detecting circuit comprising:

a reference voltage generator that generates and outputs a plurality of reference voltages, the number of the reference voltages being varied depending on a voltage width between a minimum voltage value and a maximum voltage value of an analog signal which is input;
a plurality of comparators that compares a voltage of the analog signal with each of the plurality of reference voltages output from the reference voltage generator;
a plurality of pulse generators that generates and outputs a plurality of pulse signals having varying widths among the plurality of pulse signals depending on a frequency of the analog signal; and
a combiner circuit section that outputs the pulse signals from the plurality of pulse generators by summing up,
wherein the reference voltage generator is configured to generate the number of reference voltages proportional to the voltage width between the minimum voltage value and the maximum voltage value of the analog signal which is input.

2. The analog signal detecting circuit according to claim 1, further comprising:
a minimum value detecting circuit section that detects the minimum voltage value of the analog signal and provides the minimum voltage value to the reference voltage generator; and
a maximum value detecting circuit section that detects the maximum voltage value of the analog signal and provides the maximum voltage value to the reference voltage generator.

3. The analog signal detecting circuit according to claim 1, wherein each of the pulse generators comprises:
a delay circuit section that outputs an output signal of any one of the plurality of comparators through time delay; and
an exclusive OR circuit section that has a first input terminal for receiving an output signal of a corresponding one of the plurality of comparators and a second input terminal for receiving the output signal output from the delay circuit section, and generates a pulse signal when a logic value of the output signal of the corresponding one of the plurality of comparators is different from a logic value of the output signal of the delay circuit section.

4. The analog signal detecting circuit according to claim 1, further comprising an average circuit section that is connected to the combiner circuit section and outputs an average value of the pulse signals output from the combiner circuit section.

5. The analog signal detecting circuit according to claim 4, further comprising a determination circuit section that determines whether to generate and output a trip control signal by comparing the average value output from the average circuit section with a predetermined trip reference value of an earth leakage circuit breaker.

6. The analog signal detecting circuit according to claim 5, further comprising a delay circuit section that is installed between the average circuit section and the determination circuit section, and delays the average value output from the average circuit section for a predetermined time and then outputs the average value to the determination circuit section.

7. The analog signal detecting circuit according to claim 1, further comprising a signal processor that calculates the frequency of the analog signal by counting the number of the pulse signals and dividing the number of the pulse signals by time or calculates a magnitude of the analog signal by multiplying the number of the pulse signals by a predetermined proportional coefficient, on the basis of the pulse signals output from the combiner circuit section.

8. The analog signal detecting circuit according to claim 1, wherein the plurality of pulse generators is configured to generate the plurality of pulse signals having wide widths among the plurality of pulse signals if the frequency of the analog signal is low.

* * * * *